United States Patent [19]
Murai et al.

[11] Patent Number: 6,087,213
[45] Date of Patent: *Jul. 11, 2000

[54] SEMICONDUCTOR MEMORY DEVICE AND MANUFACTURING METHOD THEREOF

[75] Inventors: Ichiro Murai; Hidemi Arakawa; Shinobu Shigeta, all of Tateyama, Japan

[73] Assignee: Nippon Steel Semiconductor Corporation, Tateyama, Japan

[ * ] Notice: This patent is subject to a terminal disclaimer.

[21] Appl. No.: 09/094,663

[22] Filed: Jun. 15, 1998

Related U.S. Application Data

[62] Division of application No. 08/734,602, Oct. 22, 1996, Pat. No. 5,851,873.

[30] Foreign Application Priority Data

Oct. 27, 1995 [JP] Japan ..................................... 7-280871
Jul. 11, 1996 [JP] Japan ..................................... 8-182543

[51] Int. Cl.⁷ .............................................. H01L 21/8234
[52] U.S. Cl. ......................... 438/238; 438/238; 438/253; 438/381; 438/396
[58] Field of Search ................................... 438/253, 396, 438/239–9, 381

[56] References Cited

U.S. PATENT DOCUMENTS

| | | |
|---|---|---|
| 5,223,448 | 6/1993 | Su . |
| 5,439,835 | 8/1995 | Gonzalez . |
| 5,501,999 | 3/1996 | Park . |
| 5,541,137 | 7/1996 | Manning . |
| 5,563,088 | 10/1996 | Tseng . |
| 5,665,210 | 9/1997 | Yamazaki . |

FOREIGN PATENT DOCUMENTS

| | | |
|---|---|---|
| 63-2372 | 1/1988 | Japan . |
| 1-255275 | 10/1989 | Japan . |
| 4-150016 | 5/1992 | Japan . |

OTHER PUBLICATIONS

Wolf et al. Silicon Processing for the VLSI Era, vol. I, Lattice Press, 1986, pp. 325–327.

Primary Examiner—John F. Niebling
Assistant Examiner—Lynne Gurley
Attorney, Agent, or Firm—Oblon, Spivak, McClelland, Maier & Neustadt, P.C.

[57] ABSTRACT

A method of making a semiconductor memory device is discussed, which has a long refresh time and offers high reliability by minimizing junction leakage current, resulting in increased charge retention time. This is achieved by optimizing the diffusion layer junction depth formed in a deeper region of the semiconductor substrate which is in electrical contact with the impurity diffusion layer. Typically, junction depth is in excess of 0.1 $\mu$m. Two methods for achieving such a structure are also provided. In one method, implantation voltage in excess of 80 KeV is used to implant P ions to form a high carrier concentration profile at a junction depth of greater than 0.1 $\mu$m. In another method, implantation process are carried out in two steps so as to force the previously implanted ions deeper into the storage node electrode, and a subsequent heat treatment is carried out to further distribute the dopant ions into the substrate of the semiconductor substrate so as to disperse crystal defects into the substrate. The resulting structure is essentially free of crystal defects which cause current leakage from the boundary region between the dopant diffusion layer and the substrate in the conventional memory cell structure.

7 Claims, 12 Drawing Sheets

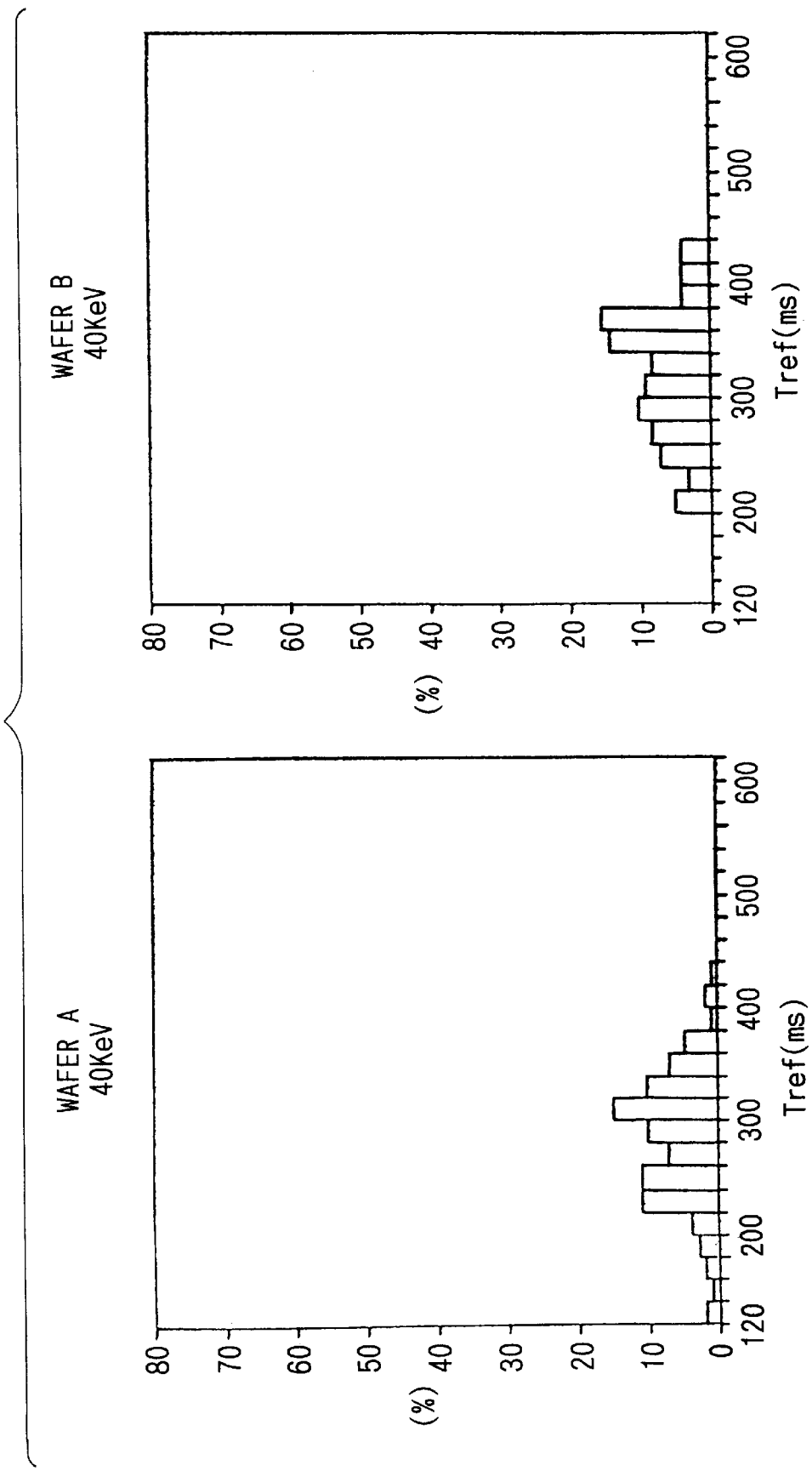

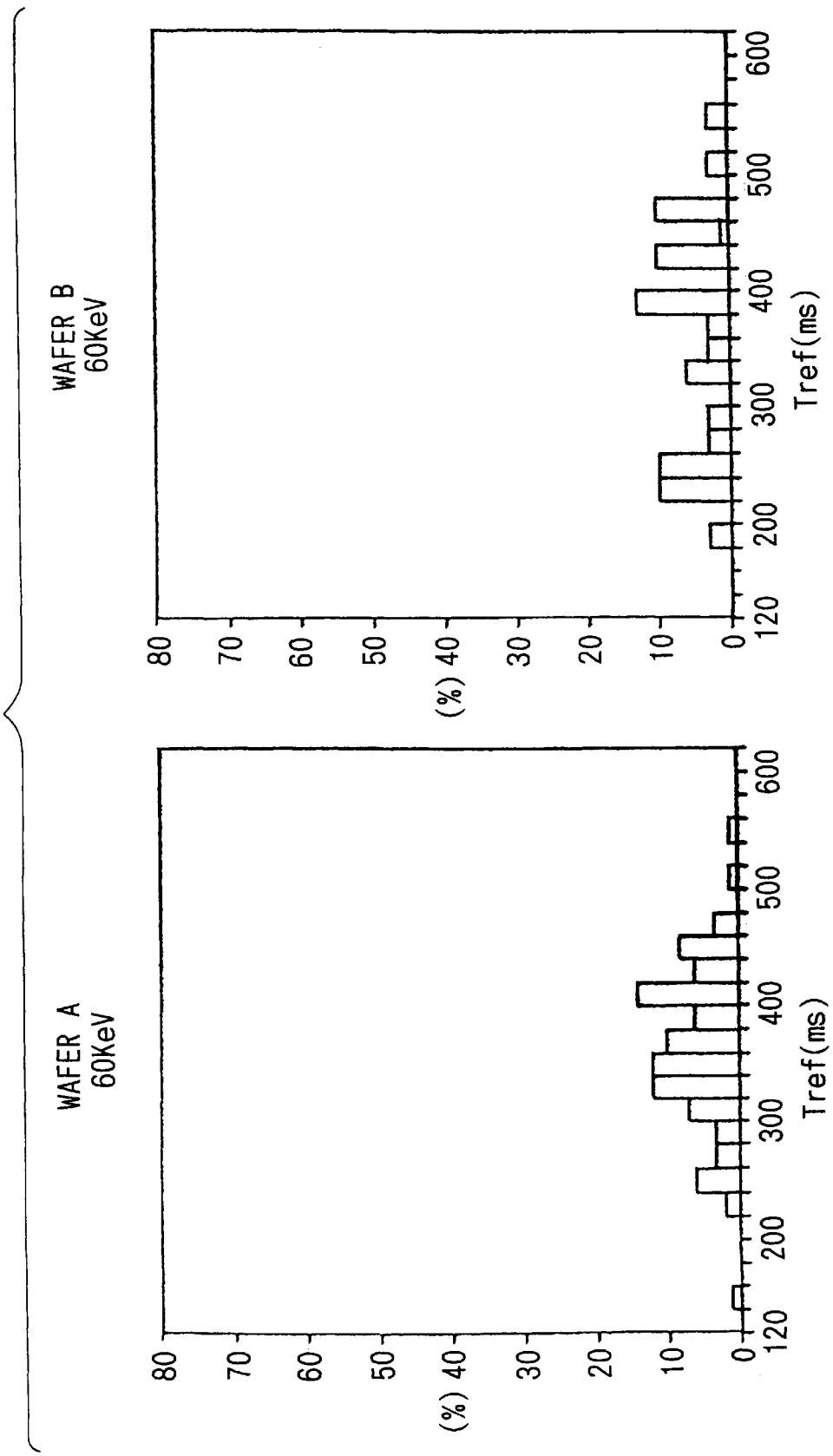

SEMICONDUCTOR MEMORY DEVICE AND MANUFACTURING METHOD THEREOF

This application is a Division of application Ser. No. 08/734,602 filed on Oct. 22, 1996 now U.S. Pat. No. 5,851,873.

BACKGROUND OF THE INVENTION

1. Field of the Invention

The present invention relates in general to metal-oxide-semiconductor (MOS) memories and manufacturing method therefor, and relates in particular to a semiconductor memory cell section suitable for use in Dynamic Random Access Memory (DRAM) devices and a manufacturing method therefor.

2. Description of the Related Art

In semiconductor memory devices such as DRAM, it is usual to utilize n-type MOS (NMOS) transistors in a memory array section (memory cell transistor) while the transistors in the peripheral circuit sections (logic circuit transistors) utilize a combination of NMOS and p-type MOS (PMOS) transistors, i.e., complementary metal oxide semiconductor (CMOS) transistor. Conventionally, NMOS transistors for use in both memory array section and the peripheral circuit section have been based on a transistors structure having both an n-type high concentration region and an n-type low concentration region in the source and drain diffusion layers, the so-called lightly-doped drain (LDD) structure which is made by a same fabrication process.

In recent years, however, it has come to be recognized that crystal defects produced during the ion implantation process for making the n-type high concentration region of memory cell transistors can no longer be ignored. For this reason, the low concentration in an n-type region has been achieved in the memory array section by using the same process conditions during the ion implantation process as those used for making n-type low concentration regions in logic circuit transistors. As for the memory cell transistors, the n-type source and drain diffusion layers have been produced using only the low concentration region.

As mentioned in a reference in IEEE ("The impact of N⁻ drain length and gate-drain/source overlap on submicrometer LDD devices for VLSI", IEEE ELECTRON DEVICE LETTERS, VOL. EDL-8, NO.10, OCTOBER 1987), the LDD structure in an n-type low concentration region is usually produced by implanting phosphorous (P⁺)ions in a dose range of $1 \times 10^{12} \sim 4 \times 10^{13}$ ions/cm² at about 40 KeV. The junction depth of the n-type low concentration region produced by this process is about 0.05 $\mu$m, and inevitably, the source and drain diffusion layers of the n-type transistors in the memory cell transistors likewise have shallow diffusion layers.

An adverse consequence regarding the capacitors in the semiconductor memory devices, such as DRAM, is that it is necessary to retain a certain degree of capacitance even if the cell size is diminished. This requirement resulted in the frequent use of capacitors having a three-dimensional architecture so as to obtain an increased effective surface area, for example, by stacking capacitors on a substrate (stacked capacitor). A conventional structure of the stacked capacitor is disclosed, for example, in a U.S. Pat. No. 5,017,982 ("CAPACITOR IN SEMICONDUCTOR DEVICE"), which makes use of arsenic(As) implantation in storage electrode film for the purpose of increasing the electrical conductivity of the storage electrode.

It should be noted, however, that shallow regions of a semiconductor memory structure, such as the regions of 0.05 $\mu$m depth from the surface of the substrate, are prone to having many crystal defects originating from various structural damages produced during processing of the memory devices. For this reason, the source and drain diffusion layers in memory cell transistors having shallow junction depth are susceptible to the adverse effects from the crystal defects, leading typically to a problem of low charge retention time of the capacitors caused by the generation of junction leakage current. This effect can be illustrated in terms of the distribution of the refresh times for a plurality of memory cells as shown in FIGS. 6A, 6B. It can be seen in these figures that the refresh times which depend on the capability of each of the memory cell to retain a memory (charge) are skewed broadly towards low refresh time (Tref), thus indicating a loss in reliability of the memory device.

SUMMARY OF THE INVENTION

It is an object of the present invention to provide a high reliability semiconductor memory device having long refresh times and a method of manufacturing the device.

The object is achieved is a semiconductor memory device comprising a memory capacitor having a storage node electrode in electrical contact with a dopant diffusion layer fabricated on a surface of a semiconductor substrate, wherein a junction depth of that portion of the dopant diffusion layer which is located beneath the storage node electrode is not less than 0.1 $\mu$m.

An aspect of the semiconductor memory device is that the storage node electrode is in electrical contact with the dopant diffusion layer through a contact hole in a contact hole region, and a junction depth of that portion of the dopant diffusion layer surrounding the contact hole region is not less than 0.1 $\mu$m. In this case, the storage node electrode may be comprised of a polysilicon film.

A method for making a semiconductor memory comprises the steps of: forming dopant diffusion layers having a junction depth of not less than 0.1 $\mu$m on a semiconductor substrate having a first conductivity type, by ion implantation of a dopant having a second conductivity type opposite in conductivity to the first conductivity type, through a top surface of the semiconductor substrate; forming an interlayer isolator film on the semiconductor substrate; forming a contact hole on the interlayer isolator film formed on top of the dopant diffusion layer; and forming the storage node electrode in electrical contact with the dopant diffusion layer on the interlayer isolator film. In practice, it is possible to produce a junction depth of more than 0.1 $\mu$m depth by implanting P ions into a p-type semiconductor substrate at an implantation energy of higher than 80 KeV. The storage node electrode may be comprised of a polysilicon film.

A second method for making a semiconductor memory device comprises the steps of: forming dopant diffusion layers on a substrate having a first conductivity type, by ion implantation of a dopant having a second conductivity type opposite in conductivity to the first conductivity type; forming an interlayer isolator film on the semiconductor substrate; opening a contact hole on the interlayer isolator film formed on the dopant diffusion layer; forming a storage node electrode film in electrical contact with the dopant diffusion layer on the interlayer isolator film; implanting dopant ions of the same conductivity type as the second conductivity type a top surface of the storage node electrode film to force the dopant ions to move deeper and penetrate into the storage node electrode film to produce a high concentration distribution profile; and performing a heat treatment process so as to diffuse out the dopant ions distributed within the deeper region of the storage node electrode film into the semiconductor substrate so as to produce a junction depth of not less than 0.1 μm for the dopant diffusion layer.

In the method described above, it is permissible to form the storage node electrode film first on the interlayer isolator film, followed by patterning the storage node electrode film to produce a storage electrode, followed by implanting dopant ions through a top surface of the storage node electrode to penetrate into the storage node electrode.

The storage node electrode may be comprised of a polysilicon film. In this case, the practice may be such that phosphorus ions are implanted into a p-type semiconductor substrate at an implantation energy of higher than 80 KeV so as to force arsenic ions which had previously been introduced into the storage node electrode film to move deeper into the storage node electrode film so as to produce a high concentration distribution profile. Or, arsenic ions may be first implanted into a p-type semiconductor substrate at an implantation energy of higher than 80 KeV, and then phosphorus ions may be implanted at an implantation energy of higher than 80 KeV so as to force the arsenic ions to move into a deeper section of the storage node electrode film so as to produce a high concentration distribution profile.

In summary, the invention is based on optimally locating the junction between the dopant diffusion layer and a semiconductor substrate so that the junction depth is essentially shifted to a deeper region of the dopant diffusion layer compared with the memory cells produced by the conventional technique. In the structure produced in the present memory device, the crystal defects, which are generally located across a region in the boundary between the semiconductor substrate and the dopant diffusion layer, have been absorbed nearly completely within the dopant diffusion layer away from the boundary, resulting in lowering of the junction leakage current.

The structure of the present memory device can be produced by the first method disclosed above, in which a semiconductor substrate having a first conductivity type is subjected to a step of implanting dopant ions having a second conductivity type with an ion beam passing through the top surface of the substrate. In practice, P ions are injected into a p-type substrate at higher than 80 KeV of implantation energy to produce a junction depth of more than 0.1 μm which is deeper than the dopant diffusion depth encountered in conventional semiconductor memory devices.

In the second method of making the memory device, the dopant ions having a second conductivity type are implanted through a top surface of a storage node electrode film into the storage node electrode film. In practice, this can be carried out either by a method in which As ions are pre-introduced into a storage node electrode film, and then P ions are implanted with an implantation energy of higher than 80 KeV, or, by another method in which As ions are implanted into a storage node electrode film with an energy of higher than 80 KeV, which is followed by implantation of P ions with an energy of higher than 80 KeV, so as to force the As ions to move into a deeper section of the storage node electrode film to generate a high concentration distribution profile. By heat treating the structure so produced, it is possible to diffuse the As ion which are in the deeper section of the storage node electrode film into the semiconductor substrate. This process enables to produce a junction depth of more than 0.1 μm.

As summarized above, according to the memory device of the present invention, by locating the boundary of between the dopant diffusion layer and the semiconductor substrate in a deeper location, more than 0.1 μm deep in the dopant diffusion layer, compared with the conventional junction depth, crystal defects which are present in the vicinity of the boundary at the top surface of the semiconductor substrate are absorbed nearly completely into the dopant diffusion layer. The result is that the refresh times of the memory cells are raised significantly, thus realizing a semiconductor memory device having high reliability.

BRIEF DESCRIPTION OF THE DRAWINGS

FIGS. 4A~4D are histograms for showing the relation between refresh times and ion implantation energies used in making the source and drain diffusion layer in an experimental example 1.

DESCRIPTION OF THE PREFERRED EMBODIMENTS

A first embodiment of the semiconductor memory device of the present invention will be presented in the following.

Figure 1:
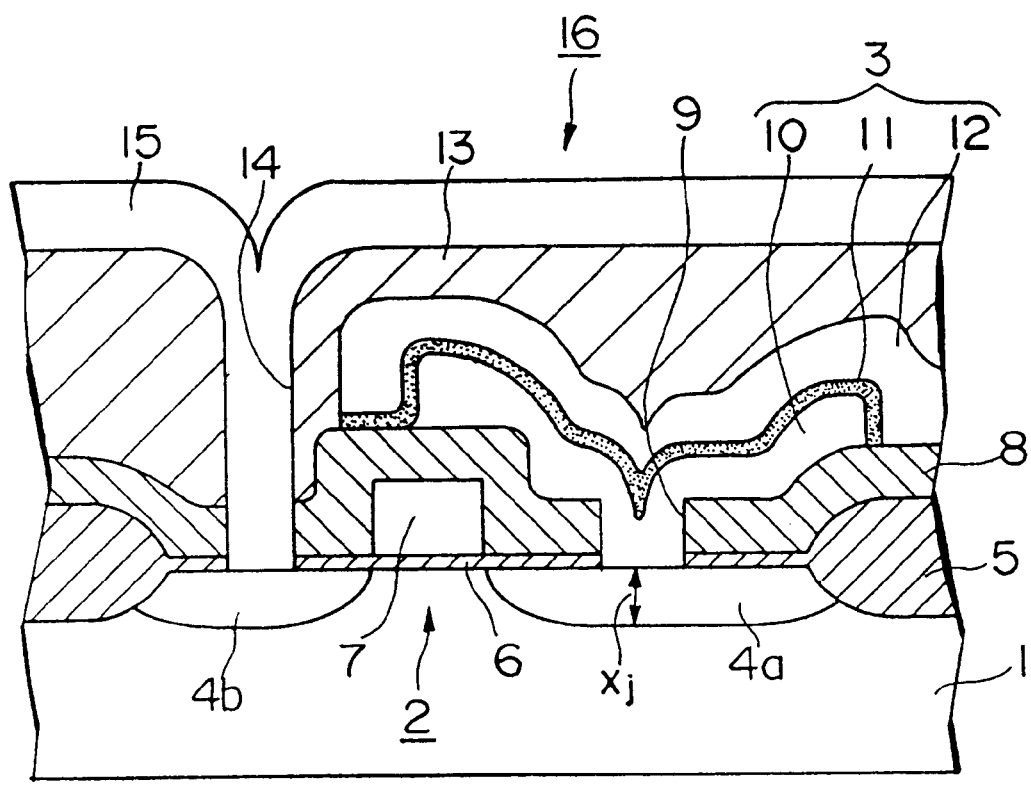
FIG. 1 is a cross sectional view of a DRAM memory cell of the first embodiment of the present invention.

FIG. 1 shows a memory section 16 within the DRAM device (semiconductor memory device) of the first embodiment, and the memory section 16 comprises: a silicon semiconductor substrate 1 (semiconductor substrate); a MOS transistor 2; a memory capacitor 3; and source and drain diffusion layers 4a, 4b.

As shown in FIG. 1, a device isolation film 5; a gate insulator film 6, a gate electrode 7, source and drain diffusion layers 4a, 4b, constituting the MOS transistor 2; are fabricated on the top surface of the silicon substrate 1. A first interlayer isolator film 8 formed on top of the source and drain diffusion layers 4a, 4b is provided with a cell contact hole 9, and the remaining structures, a storage node electrode 10, a dielectric film 11, and a cell plate electrode 12 constituting a capacitor 3, are successively fabricated on top.

Additionally, a second interlayer isolator film 13 having a bit contact hole 14 for electrical contact to a bit line 15 is produced to cover over the structures formed previously. The junction depth xj indicated in FIG. 1 for the source and drain diffusion layers 4a, 4b ranges between 0.1~0.15 μm.

Next, a method of making the DRAM memory cell of the structure presented above will be explained.

Figure 2A:
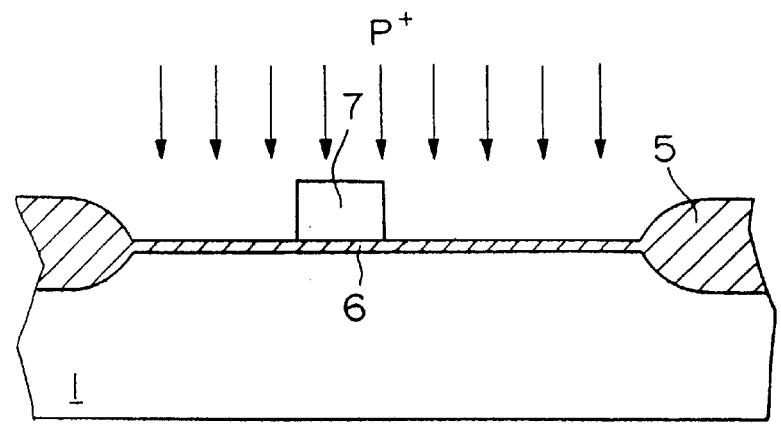
FIGS. 2A~2C show the steps in the process flowchart for manufacturing the DRAM memory cell of the first embodiment shown in FIG. 1.

First, as shown in FIG. 2A, an interdevice isolator film 5 having a film thickness of 500~1,000 nm comprising a silicon dioxide film is fabricated, by the method of local oxidation of silicon (LOCOS), on the top surface of a p-type silicon substrate 1 having a specific resistance value of 1~12 Ω·cm. Next, a gate isolator film 6, having a film thickness in a range of 10~20 nm comprised of a silicon dioxide film, is fabricated by the method of thermal oxidation.

The above step is followed by a chemical vapor deposition (CVD) process to form a polysilicon film doped with P at a carrier concentration range of $1\times10^{20}\sim4\times10^{20}$ (abbreviated to 1E20,4E20 herein below) atoms/cm$^3$, and a gate electrode 7 is fabricated by generating a pattern by the well known photolithographic method combined with etching.

Figure 2B:
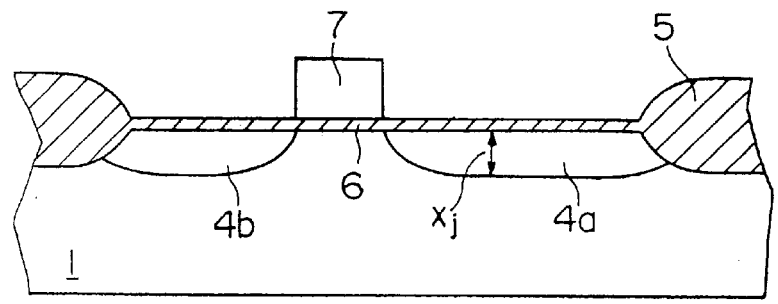

Next, ion implantation is employed to produce the source and drain diffusion layers 4a, 4b shown in FIG. 2B by implanting P ions at an ion dose range of 1E13~1E14 ions/cm$^2$ into the silicon substrate 1 with an implantation energy range of 80~120 KeV.

In general, the projection range of ions during an ion implantation process is a function of the type of ion and the implantation energy. For example, if P ions are implanted into a silicon substrate at implantation energies of 80, 100 and 120 KeV, the corresponding projection ranges, i.e. the depth (average depth) of implantation from the surface of the substrate, will be approximately 0.1, 0.12 and 0.15 $\mu$m, respectively. It follows that the junction depths of the source and drain diffusion layers 4a, 4b produced by the ion implantation achieved in this embodiment will be in the range of 0.1~0.15 $\mu$m.

Figure 2C:
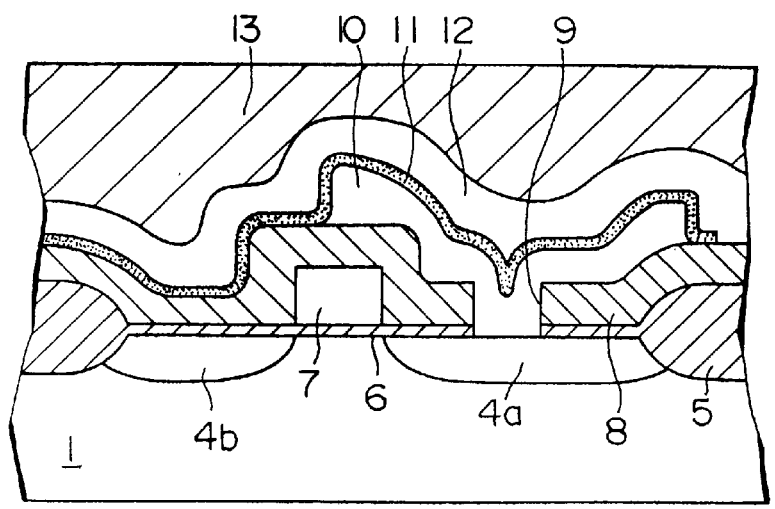

Next, as shown in FIG. 2C, a first interlayer isolator film 8 comprising silicon dioxide film of 100~300 nm thickness is produced by a CVD method. Next, cell contact hole 9 is fabricated on top of the source diffusion layer 4a by using the well known combination of photolithography and etching. This step is followed by the same step as in the case of making the gate electrode 7 to produce a storage node electrode 10 comprised of P doped polysilicon. Next, using the CVD method, a capacitor isolator film 11 comprising silicon nitride of 5~10 nm film thickness is deposited, and this step is followed by the same process as that for making the gate electrode 7 to produce a cell plate electrode 12. This step is followed by a step of making a second interlayer isolator film 13 comprising a silicon dioxide film of 500~1,000 nm thickness by the CVD method.

Next, as shown in FIG. 1, a bit contact hole 14 is fabricated on the source and drain diffusion layer 4b located opposite to the cell contact hole 9 produced on the source and drain diffusion layer 4a by using the known photolithography and etching method. This step is followed by a step of forming an aluminum layer of 500~1,000 nm thickness by the sputtering method, which is patterned into bit line 15 by using the photolithography and etching method. This step completes the fabrication process of DRAM memory cells 16.

A second embodiment of the memory cells will now be explained in the following.

Figure 3A:
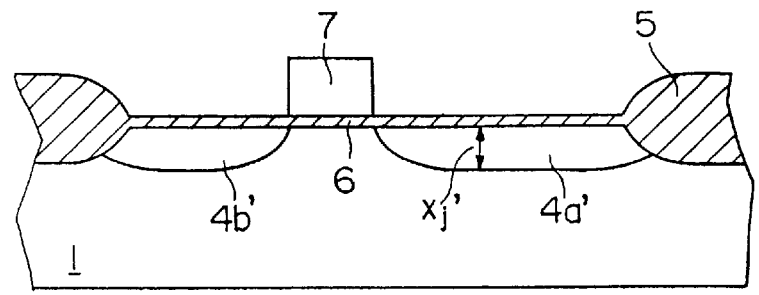
FIGS. 3A~3C show the steps in the process flowchart for manufacturing the DRAM memory cell of a second embodiment.
Figure 3B:
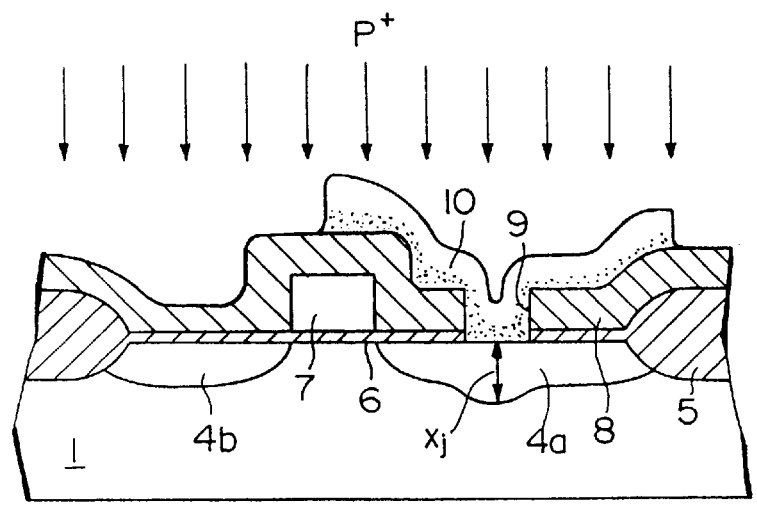
Figure 3C:
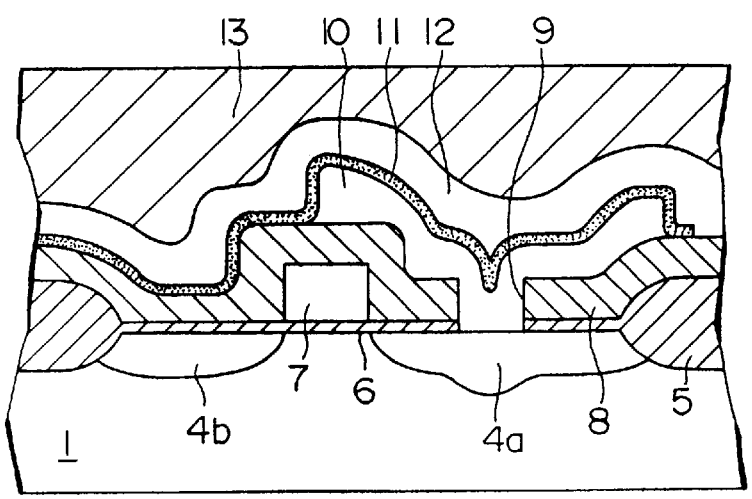
Figure 4C:
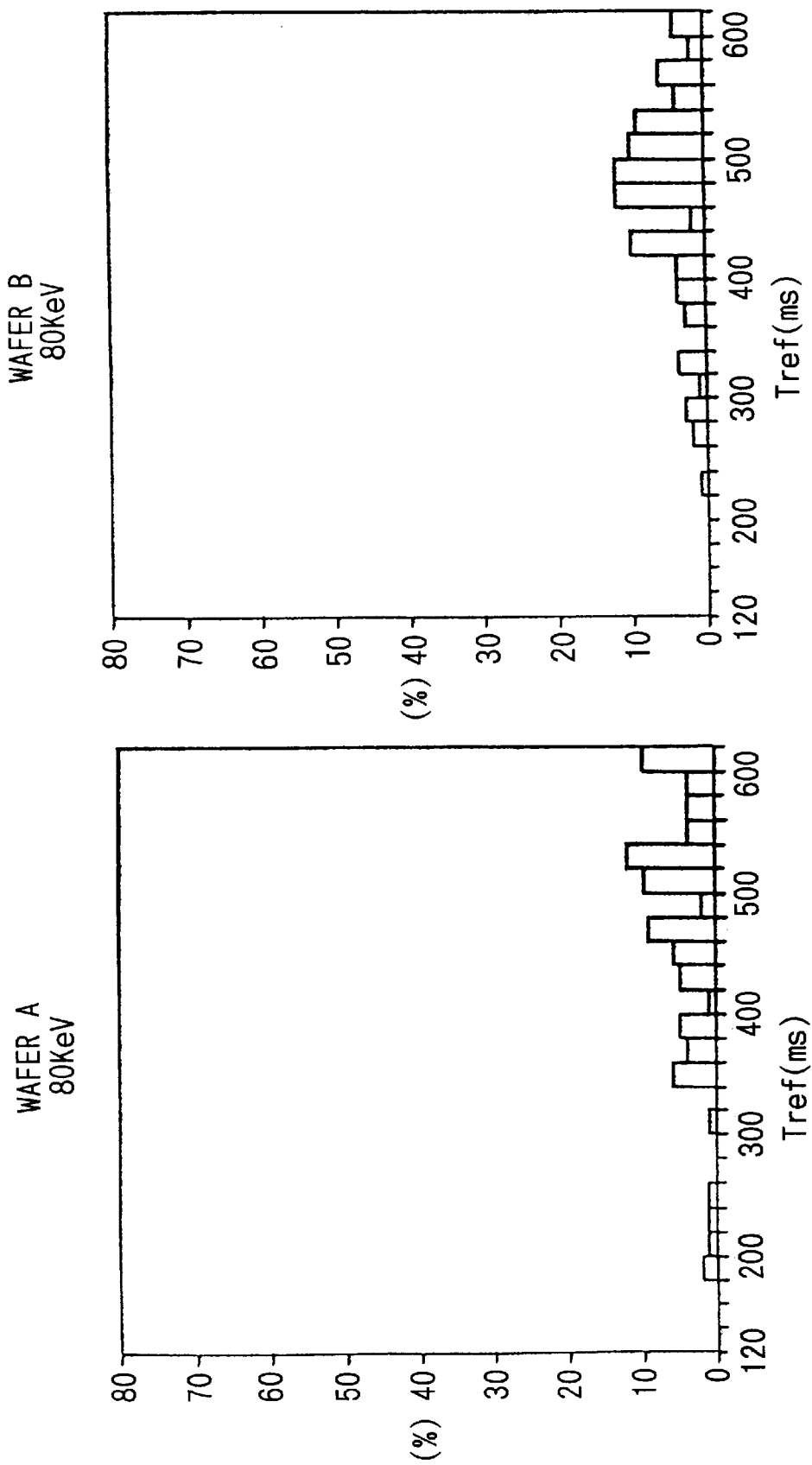
Figure 4D:
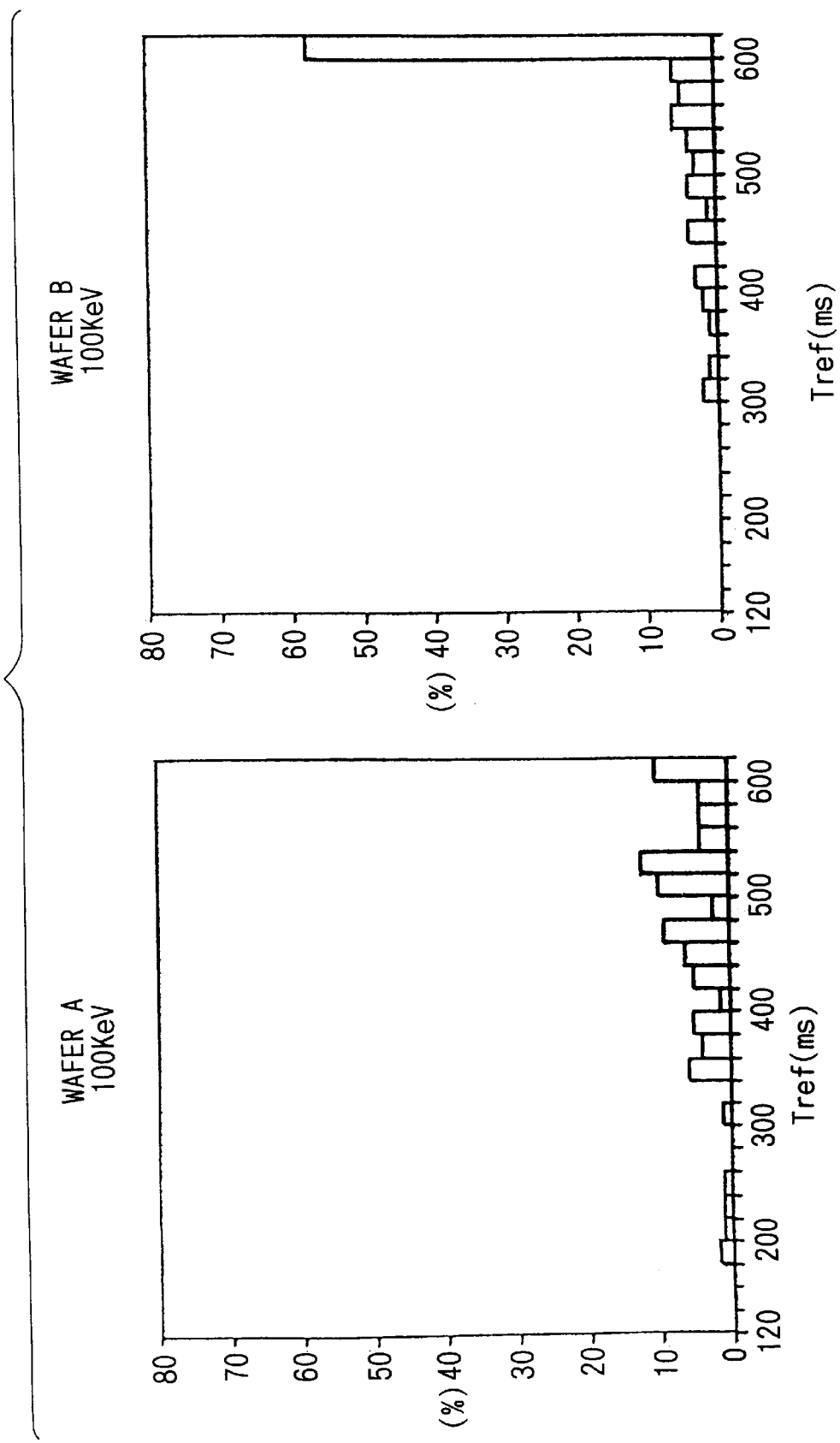

FIGS. 3A~3C show the steps of making the memory cells according to the method of the second embodiment. The second method can also fabricate the same configuration of memory cells as in the first embodiment, however, in the second embodiment, only the junction depth of the source and drain diffusion layer which is directly below the contact cell hole region is fabricated to be in the range of 0.1~0.15 $\mu$m. The same reference numerals are used in FIGS. 3A~3C to denote those elements in the second embodiment which are the same as those in the first embodiment shown in FIGS. 2A~2C.

First, as shown in FIG. 3A, an interdevice isolator film 5 comprising silicon dioxide having a film thickness of 500~1,000 nm is fabricated on top of a p-type substrate having a specific resistance in a range of 1~12 $\Omega$·cm by the LOCOS method. Next, using the thermal oxidation method, a gate isolator film 6 comprising silicon dioxide having a film thickness of 10~20 nm is produced.

The above steps are followed by a step of depositing a CVD polysilicon layer having a thickness of 200~500 nm, and doped with an ion dose concentration of 1E20~4E20 atoms/cm$^3$, which is fabricated into gate electrodes 7 by patterning using the known photolithography and etching method. The processing steps to this stage are the same as those in the first embodiment.

Next, by using the ion implantation method, the source and drain diffusion layers 4a', 4b' are fabricated at an implantation energy 50 KeV and an ion dose concentration of 1E13~1E14 ions/cm$^2$ to implant P ions into a silicon substrate. The projection range for the P ions implanted into silicon substrate at 50 KeV is about 0.06 $\mu$m. Therefore, at this stage, the values of the junction depth xj' are about 0.06 $\mu$m for both source and drain diffusion layers 4a', 4b'.

Next, as shown in FIG. 3B, a first interlayer isolator film 8 comprising silicon dioxide and having a layer thickness of 100~300 nm is produced by the CVD method. Next, using the known photolithography and etching method, cell contact holes 9 are produced on the source and drain diffusion layer 4a'. A undoped polysilicon film (storage node electrode film) having a film thickness of 100~150 nm is deposited by the CVD method, to produce storage node electrodes 10 by patterning using the known photolithography and etching method.

Next, arsenic (As) ions are implanted on the overall surface of the wafer, followed by implantation of P ions at an implantation energy of 80~120 KeV and an ion dose concentration of 5E12~1E14 ions/cm$^2$. In this process, the P ions implanted subsequent to the As ions collide with the previously implanted As ions to push the As ions deeper within the storage node electrode 10 to distribute the As ions in a deeper region to generate a high concentration profile.

The above steps are followed by a thermal treatment step to diffuse the As ions, distributed in the deeper region of the storage electrode 10 in the contact cell hole region, out of the storage node electrode 10 into the semiconductor substrate 1. It follows that the junction depth xj of the source and drain diffusion layers 4a, 4b in the contact cell hole region after this step is increased from the previous depth of 0.06 $\mu$m to a deeper depth at 0.1~0.15 $\mu$m.

Next, as shown in FIG. 3C, a capacitor insulator film 11 is deposited by the CVD method to produce a silicon nitride film having a film thickness of 5~10 nm. Next, by using the same method as that used to produce the gate electrode 7, a cell plate electrode 12 comprised of doped polysilicon is produced. After this step, a second interlayer insulator film 13 comprised of silicon dioxide film having a film thickness of 500~1,000 nm is deposited by the CVD method.

Following the above steps, a bit contact hole 14 is fabricated on the source and drain diffusion layers 4b in an area opposite to the cell contact hole 9, as shown in FIG. 1, by using the known photolithography and etching method. This step is followed by a step of forming an aluminum layer of 500~1,000 nm thickness by the sputtering method, which is patterned into bit lines 15 by using the photolithography and etching method. This step completes the fabrication process of DRAM memory cells 16.

EXPERIMENTAL EXAMPLES

To demonstrate the effectiveness of the memory cells made by the methods of the present invention, experimental investigations were carried out by changing the ion implantation energy using the two methods described above: that is, (1) to implant ions on the silicon substrate presented in the first embodiment and (2) to implant ions from the open surface of the storage node electrode presented in the second embodiment. The results are described in the following.

Experimental Example 1

In this experiment, P ions were implanted into a p-type silicon substrate in accordance with the method presented in the first embodiment to produce the source and drain diffusion layers. Two wafers were used at each of the implantation energies of 40, 60, 80 and 100 KeV, and refresh times of each circuits produced on the wafers were determined. The results of refresh time measurements (Tref) are shown in FIGS. 4A~4D.

As demonstrated in FIGS. 4A~4D, as the implantation energy is increased from 40 to 100 KeV in steps, it was discovered that the distribution of refresh times shifted towards longer refresh times. It was noted further that the center of the distribution of the wafers, made using the implantation energy of 40 KeV which is the value in the conventional practice, was in the vicinity of 300 msec. At 60 KeV, there was no significant change, but at 80 KeV, the center was shifted to 500 msec, and at 100 KeV, it was shifted further to above 600 msec.

As mentioned previously, the junction depths of the source and drain diffusion layers in the wafers implanted at 40, 60, 80 and 100 KeV were, respectively, 0.05, 0.07, 0.1 and 0.12 $\mu$m. It has been demonstrated, therefore, that by producing a junction depth in excess of 0.1 $\mu$m, the refresh times can be improved significantly compared with the wafers made by the conventional approach.

Experimental Example 2

In this experiment, implantation of P and As ions was carried out from the top surface of the storage node electrode in accordance with the method presented in the second embodiment. The implantation energies were varied from 60, 80 to 100 KeV, and the refresh times in the circuits produced on a wafer were determined. The results of refresh time measurements (Tref) are shown in FIGS. 5A~5C.

Figure 5A:
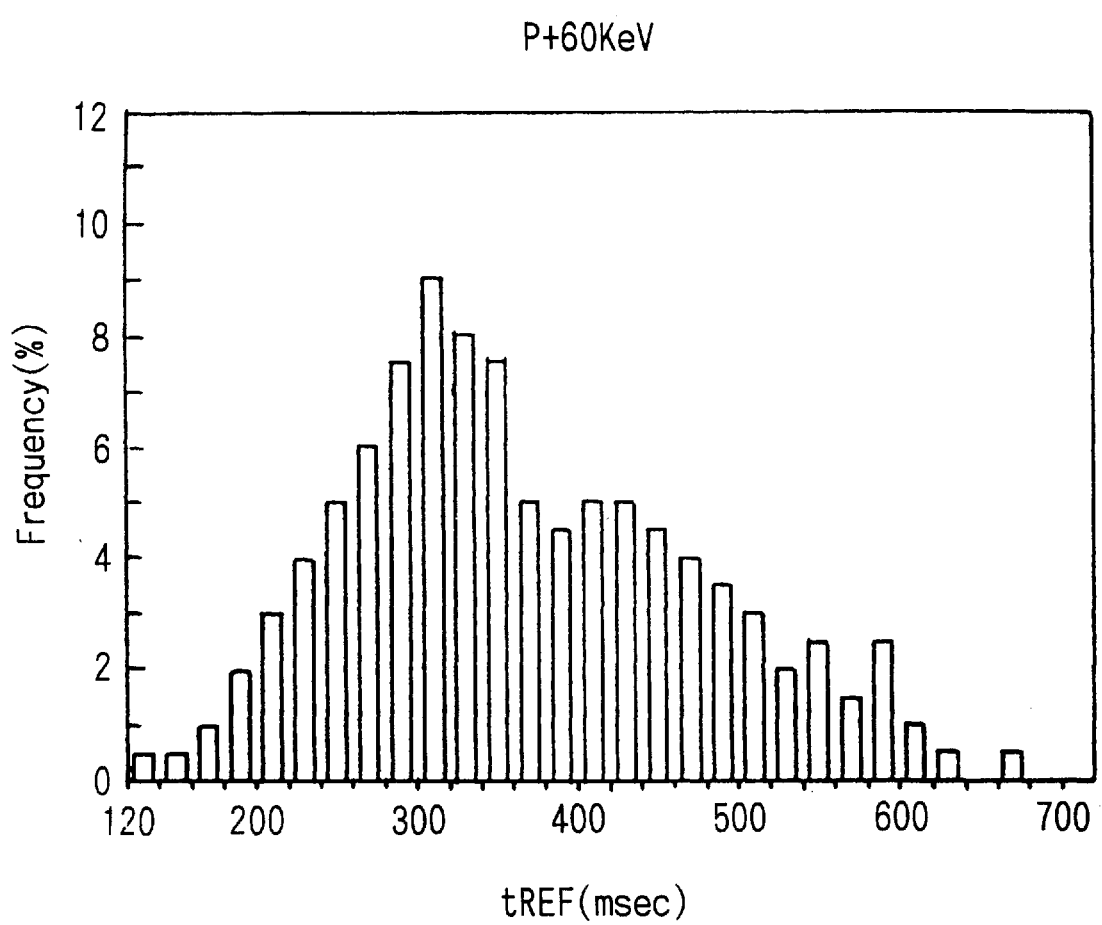
FIGS. 5A~5C are histograms for showing the relation between refresh times and ion implantation energies used in making the source and drain diffusion layer in an experimental example 2.
Figure 5B:
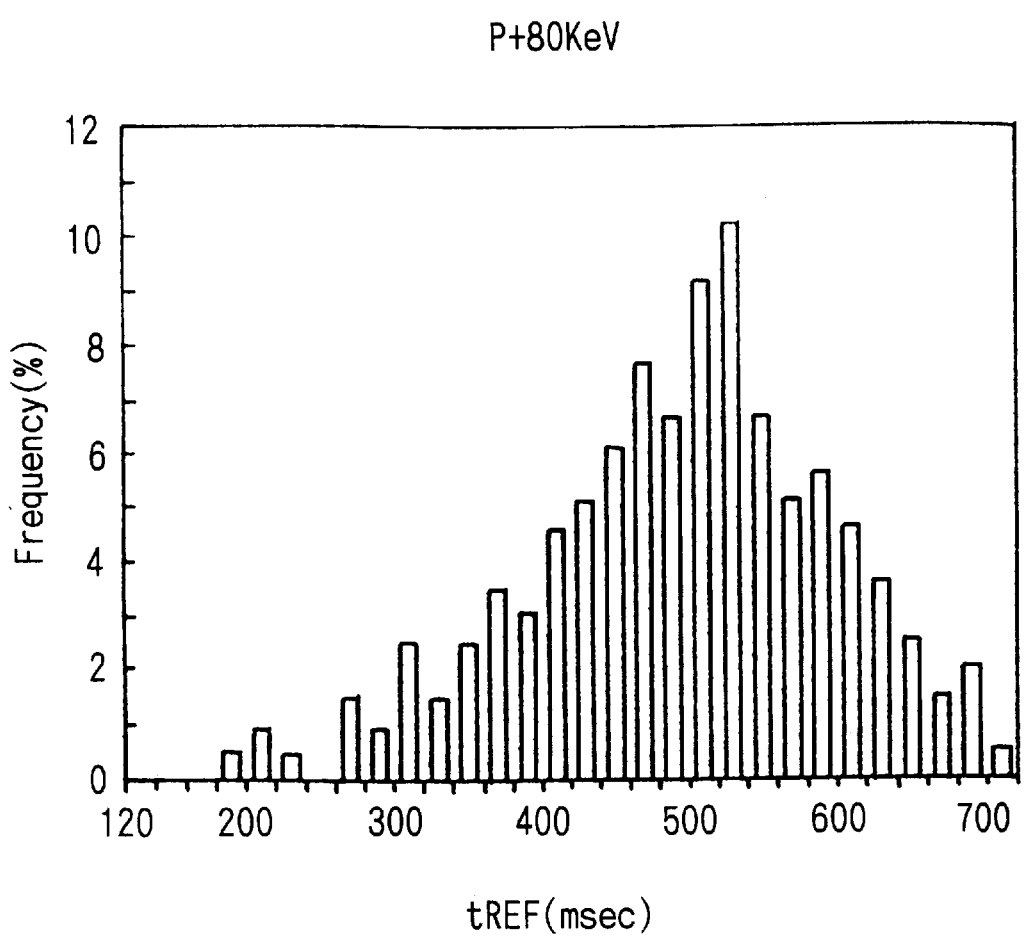
Figure 5C:
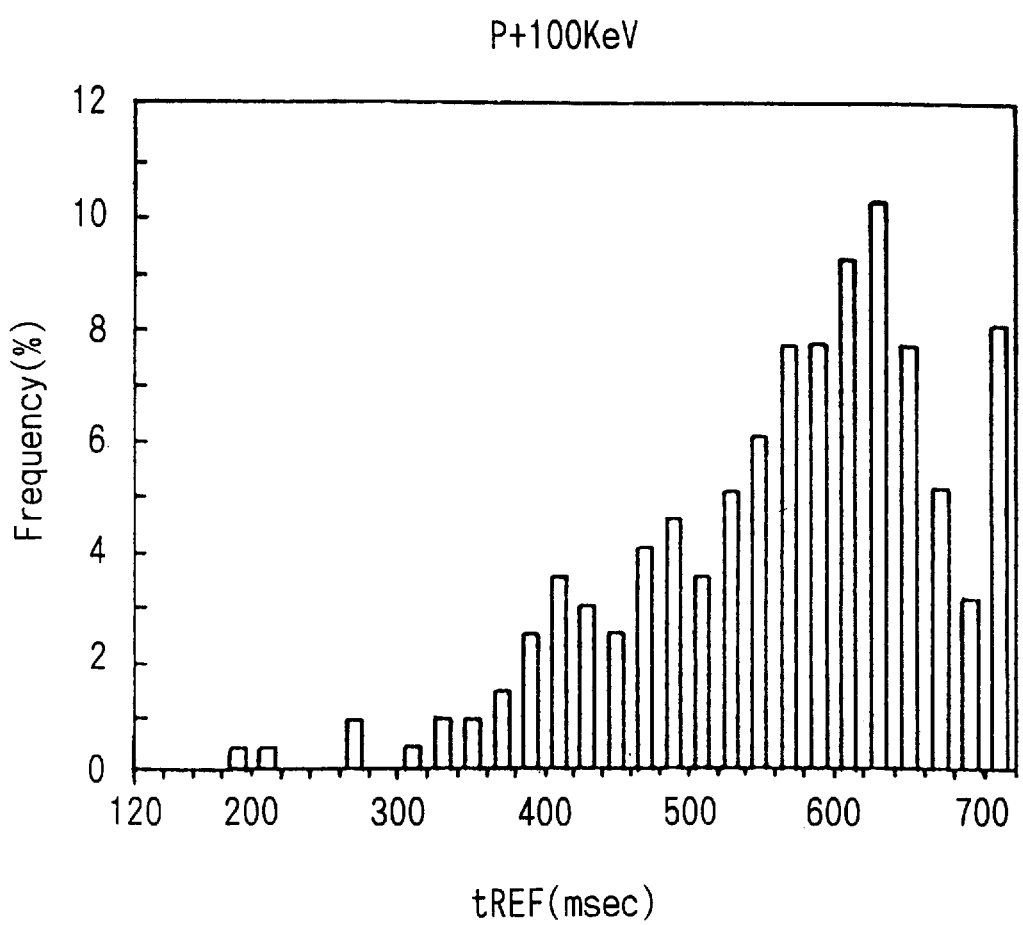
Figure 6A:
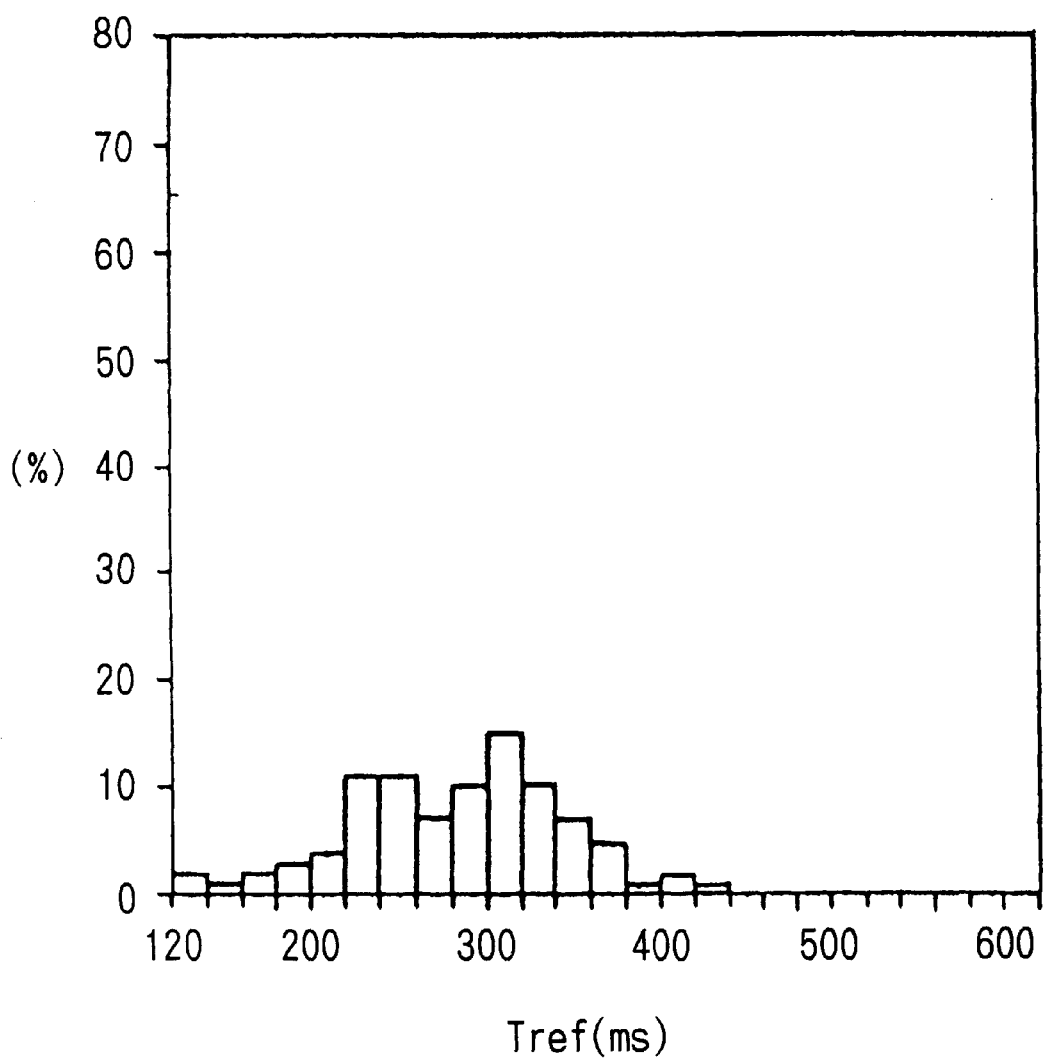
FIGS. 6A and 6B are histograms showing the distribution of refresh times in the conventional DRAM memory cells.
Figure 6B:
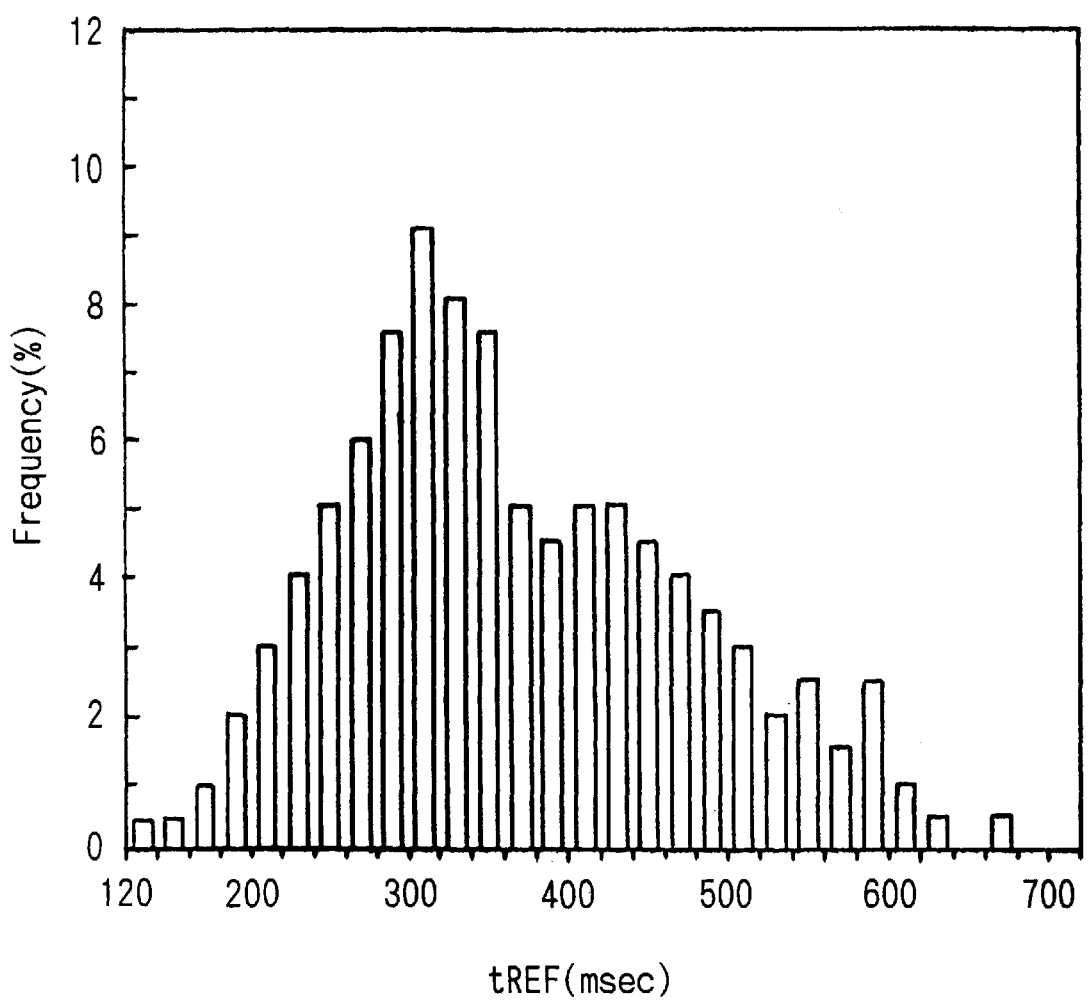

As shown in FIGS. 5A~5C, as the implantation energy was increased from 60 to 100 KeV in steps, it was discovered that the distribution of refresh times shifted towards longer refresh times. It was observed that when the implantation energy was 60 KeV, the center of distribution was in the vicinity of 300 msec, but as the energy was increased to 80 KeV, the center of the distribution shifted to about 500 msec, and at 100 KeV, the center was located above 600 msec.

The junction depths of the source and drain diffusion layers in the wafers implanted at 60, 80 and 100 KeV were, respectively, 0.07, 0.1 and 0.12 $\mu$m. It has been demonstrated, therefore, that by producing a junction depth in excess of 0.1 $\mu$m, the refresh times can be improved significantly compared with the wafers made by the conventional approach.

The methods of making DRAM memory cells presented in the first and second embodiments are based on optimizing the implantation energy in the case of either approaches: that is, the method related to implanting the dopant ions directly from the surface of the silicon substrate, or implanting the dopant ions into the storage node electrode first, followed by subsequent diffusion of dopant ions into the silicon substrate. It has further been demonstrated by experiments that, by processing the wafers so as to produce a junction depth xj of deeper than 0.1 $\mu$m, which is deeper than the conventional junction depth, crystal defects present in the substrate can be completely removed away from the junction region between the diffusion layer and the substrate to be present mostly within the diffusion layers. The result is that the junction leakage current is lowered, leading to a significant improvement in the refresh times thereby enable to realize high reliability DRAM memory cells.

It should be noted that, in the second embodiment, ion implantation was carried out after patterning the storage electrodes, but it is permissible to carry out implantation step through the polysilicon film first before patterning. It is clear that the practical processing conditions, such as the thickness of various films, can be varied depending on the nature of the device to be fabricated. It should be clear also that the detailed methodology and the apparatus used in each processing steps can be selected to suit each application.

What is claimed is:

1. A semiconductor memory device comprising a memory capacitor having a storage node electrode in electrical contact with a dopant diffusion region fabricated on a top surface of a semiconductor substrate, wherein a junction depth of said dopant diffusion region is at least 0.1 $\mu$m and no greater than 0.15 $\mu$m.

2. A semiconductor memory device as claimed in claim 1, wherein said storage node electrode is in electrical contact with said dopant diffusion region through a contact hole fabricated in a contact hole region and a junction depth of said dopant diffusion region which surrounds said contact hole region is at least 0.1 $\mu$m and not greater than 0.15 $\mu$m.

3. A semiconductor memory device as claimed in claim 1, wherein said storage node electrode is comprised of a polysilicon film.

4. A method for making a semiconductor memory device provided with a memory capacitor having a storage node electrode in electrical contact with a dopant diffusion region through a contact hole, comprising the steps of:

forming said dopant diffusion region having a junction depth of at least 0.1 $\mu$m and no greater than 0.15 $\mu$m in a top surface of a semiconductor substrate having a first conductivity type by ion implanting a dopant having a second conductivity type opposite in conductivity to said conductivity type into said top surface of said semiconductor substrate;

forming an interlayer isolator film on said semiconductor substrate;

forming said contact hole through said interlayer isolator film to expose a top surface of said dopant diffusion region;

forming said storage node electrode to have a portion extending through the contact hole to be in electrical contact with said exposed top surface of said dopant diffusion region; and providing a dielectric layer and cell plate electrode layer over the storage node electrode to form the memory capacitor.

5. A method of making a semiconductor device as claimed in claim 4, wherein said dopant diffusion region is fabricated by implanting phosphorus ions into a p-type semiconductor substrate at an implantation energy of not less than 80 KeV so as to produce the junction depth of at least 0.1 $\mu$m and no greater than 0.15 $\mu$m.

6. A method of making a semiconductor device as claimed in one of claim 4 or 5, wherein said storage node electrode is comprised of a polysilicon film.

7. A fabrication method for a DRAM memory device that has a capacitor made according to the method of claim 4.

* * * * *